United States Patent
Choi

(10) Patent No.: US 11,729,526 B1
(45) Date of Patent: Aug. 15, 2023

(54) HIGH DYNAMIC RANGE CMOS IMAGE SENSOR PIXEL WITH REDUCED METAL-INSULATOR-METAL LATERAL OVERFLOW INTEGRATION CAPACITOR RESET SETTLING

(71) Applicant: OMNIVISION TECHNOLOGIES, INC., Santa Clara, CA (US)

(72) Inventor: Woon Il Choi, Sunnyvale, CA (US)

(73) Assignee: OmniVision Technologies Inc., Santa Clara, CA (US)

( * ) Notice: Subject to any disclaimer, the term of this patent is extended or adjusted under 35 U.S.C. 154(b) by 0 days.

(21) Appl. No.: 17/808,899

(22) Filed: Jun. 24, 2022

(51) Int. Cl.
  *H04N 25/59* (2023.01)
  *H04N 25/75* (2023.01)
  *H04N 25/709* (2023.01)

(52) U.S. Cl.
  CPC ........... *H04N 25/59* (2023.01); *H04N 25/709* (2023.01); *H04N 25/75* (2023.01)

(58) Field of Classification Search
  CPC .... H04N 25/766; H04N 5/3741; H04N 25/59; H04N 5/3559; H04N 25/709; H04N 5/3698; H04N 25/75; H04N 5/378
  See application file for complete search history.

(56) References Cited

U.S. PATENT DOCUMENTS

| | | |
|---|---|---|
| 4,323,986 A | 4/1982 | Malaviva |
| 10,134,788 B2 | 11/2018 | Lyu et al. |
| 10,154,222 B2 * | 12/2018 | Sugawa .................. H04N 25/77 |
| 11,212,457 B2 | 12/2021 | Dai et al. |
| 2015/0076330 A1 | 3/2015 | Lyu et al. |
| 2018/0234652 A1 * | 8/2018 | Sugawa .................. H04N 25/77 |
| 2021/0168312 A1 | 6/2021 | Madurawe et al. |
| 2021/0183926 A1 | 6/2021 | Choi et al. |

OTHER PUBLICATIONS

"A Sensitivity and Linearity Improvement of a 100-dB Dynamic Range CMOS Image Sensor Using a Lateral Overflow Integration Capacitor", IEEE Journal of Solid-State Circuits, vol. 41, No. 4, Apr. 2006, pp. 851-858 (Year: 2006).*

(Continued)

*Primary Examiner* — Nicholas G Giles
(74) *Attorney, Agent, or Firm* — Perkins Coie LLP

(57) ABSTRACT

A pixel circuit includes a transfer transistor coupled between a photodiode and a floating diffusion. A lateral overflow integration capacitor (LOFIC) includes an insulating region disposed between a first metal electrode coupled to a bias voltage source, and a second metal electrode selectively coupled to the floating diffusion. A multifunction reset transistor includes a gate, a drain, a first source, and a second source. The drain, the first source, and the second source are coupled to each other in response to a multifunction reset control signal turning the multifunction reset transistor on. The drain, the first source, and the second source are decoupled from one another in response to the multifunction reset control signal turning the multifunction reset transistor off. The drain is coupled to a reset voltage source, the first source is coupled to the first metal electrode, and the second source is coupled to the second metal electrode.

17 Claims, 4 Drawing Sheets

(56) References Cited

OTHER PUBLICATIONS

Innocent, M., "Modeling, Characterization and Simulation of Dielectric Absorption in Capacitors in Image Sensors", 2021 International Image Sensor Workshop, publication date Sep. 13, 2021 (4 pages).
Sakano, Y. et al., "A 132dB Single-Exposure-Dynamic-Range CMOS Image Sensor with High Temperature Tolerance", 2020 IEEE International Solid-State Circuits Conference, Feb. 17, 2020 (22 pages).

* cited by examiner

HIGH DYNAMIC RANGE CMOS IMAGE SENSOR PIXEL WITH REDUCED METAL-INSULATOR-METAL LATERAL OVERFLOW INTEGRATION CAPACITOR RESET SETTLING

BACKGROUND INFORMATION

Field of the Disclosure

This disclosure relates generally to image sensors, and in particular but not exclusively, relates to high dynamic range (HDR) complementary metal oxide semiconductor (CMOS) image sensors.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and photogenerate image charge upon absorption of the image light. The image charge photogenerated by the pixels may be measured as analog output image signals on column bitlines that vary as a function of the incident image light. In other words, the amount of image charge photogenerated is proportional to the intensity of the image light, which are read out as analog signals from the column bitlines and converted to digital values to produce digital images (i.e., image data) that represent the external scene.

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range. One common technique to increase dynamic range is to merge multiple exposures captured with different exposure settings using standard (low dynamic range) image sensors into a single linear HDR image, which results in a much larger dynamic range image than a single exposure image.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
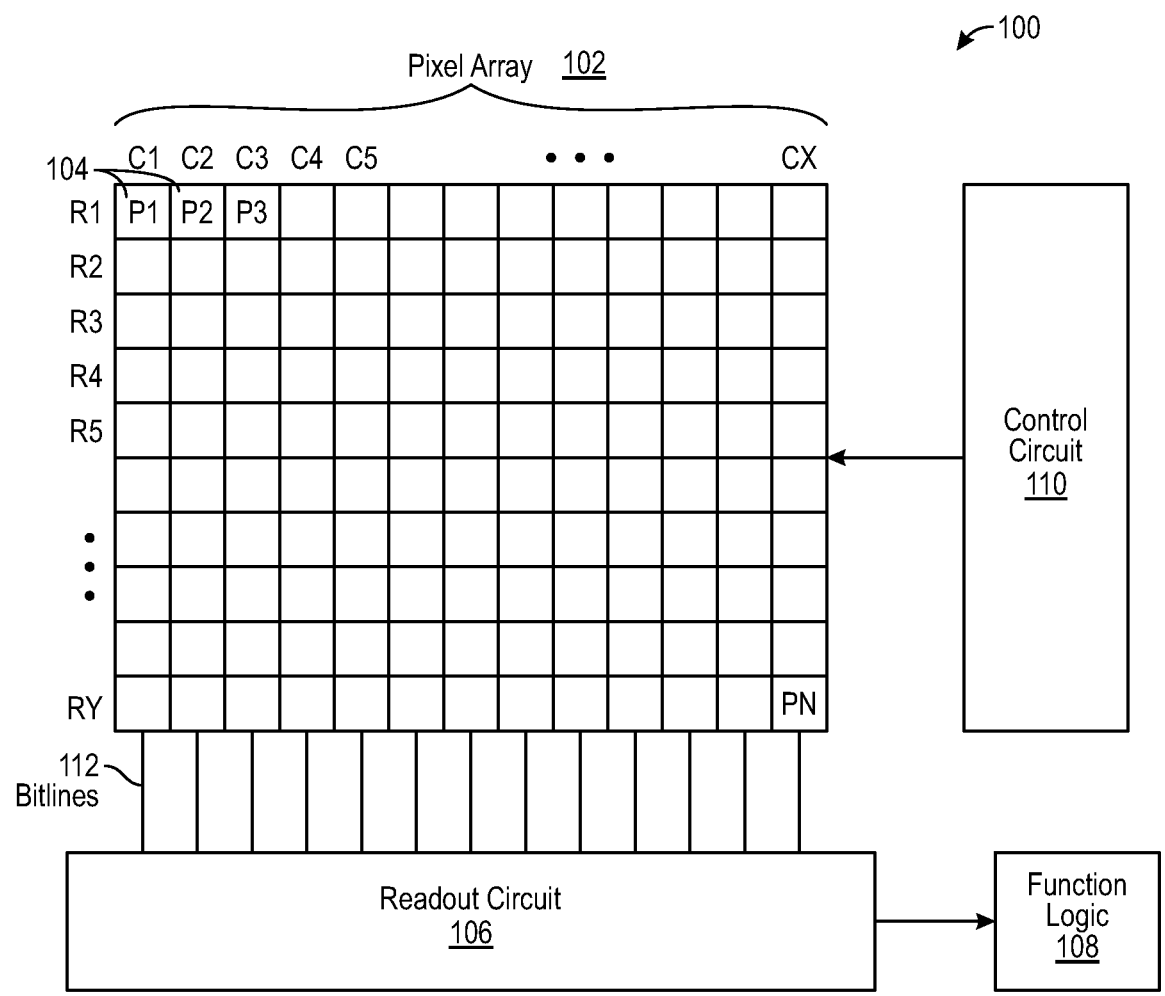
FIG. 1 illustrates one example of an imaging system including a pixel array in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to an imaging system with a pixel array including pixel circuits with LOFICs providing reduced image lag are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system include a pixel array with pixel circuits including lateral overflow integration capacitors (LOFICs) configured to provide reduced image lag are disclosed. It is appreciated that LOFICs may be included in pixel circuits to increase the full well capacity of the pixel circuits and thereby increase high dynamic range capabilities of corresponding image sensors. LOFIC capacitance is positively correlated with full well capacity. Thus, as the capacitance of a LOFIC employed in a pixel circuit increases, the full well capacity of the pixel circuit also increases. For this reason, higher LOFIC capacitance is commonly desired. However, due to the huge RC loading as the capacitance of a LOFIC increases, the time required for row drivers of the imaging system to charge and/or reset the LOFIC also increases. Consequently, as the capacitances of LOFICs in pixel circuits increase, image lag increases, which causes slower frame rates.

It is appreciated that the image lag caused by LOFICs can be associated with the high dielectric constant or high-k material included in the insulation material of metal-insulator-metal (MIM) LOFICs due to the hysteresis characteristics and slow relaxation behavior of high-k materials. The high-k material relaxation behavior can cause the degraded image quality such as image lag due to many mechanisms including trap-to-trap tunneling, structural relaxation, coupling with phonon energy, etc.

With fixed readout speeds and frame readout speeds of image sensors, it is appreciated that LOFICs included pixel circuits may be reset during idle periods as well as during precharge periods and reset level signal readout operations to reduce image lag in accordance with the teachings of the present invention. Thus, as will be shown in the various examples below, an example pixel circuit includes a photodiode configured to photogenerate image charge in response to incident light. A floating diffusion is coupled to receive the image charge from the photodiode. A transfer transistor coupled between the photodiode and the floating diffusion and is configured to transfer the image charge from the photodiode to the floating diffusion. A lateral overflow integration capacitor (LOFIC) including an insulating region is disposed between a first metal electrode and a second metal electrode. The first metal electrode is coupled to a bias voltage source and the second metal electrode is selectively coupled to the floating diffusion, allowing excess photogenerated charges (e.g., generated in strong light condition) to overflow from the photodiode to lateral overflow integration capacitor. The pixel circuit also includes a multifunction reset transistor that includes a gate, a drain, a first source, and a second source. The gate of the multifunction reset transistor is coupled to receive a multifunction reset control signal. The drain, the first source, and the second source of the multifunction reset transistor are coupled to each other in response to the multifunction reset control signal turning the multifunction reset transistor on, while the drain, the first source, and the second source are decoupled from one another in response to the multifunction reset control signal turning the multifunction reset transistor off. In the various examples, the drain is coupled to a reset voltage source, the first source is coupled to the first metal electrode, and the second source is coupled to the second metal electrode.

Thus, during operation, the multifunction reset transistor included in the pixel circuit is configured to internally couple the photodiode, the floating diffusion, and the first and second metal electrodes to the reset voltage source within the pixel circuit through the multifunction reset transistor during a precharge period as well as during reset level signal readout operations of the pixel circuit in accordance with the teachings of the present invention. It is appreciated that since the LOFIC is locally reset within the pixel circuit through the multifunction reset transistor instead of by a row driver of the imaging system, image lag is reduced since there is no longer the huge RC load on the row driver of the imaging system when resetting the LOFICs in the imaging system.

To illustrate, FIG. 1 shows one example of an imaging system 100 having a pixel array with pixel circuits including LOFICs that are configured to provide reduced image lag in accordance with the teachings of the present invention. In particular, the example depicted in FIG. 1 illustrates an imaging system 100 that includes a pixel array 102, bitlines 112, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, each pixel circuit 104 may include one or more photodiodes configured to photogenerate image charge in response to incident light. The image charge generated in the one or more photodiodes is transferred to a floating diffusion included in each pixel circuit 104, which may be converted to an image signal, which is then read out from each pixel circuit 104 by readout circuit 106 through column bitlines 112. As will be discussed, in the various examples, pixel circuits 104 are also be configured to provide HDR image signals, in which case, the image charge generated by the one or more photodiodes in bright lighting conditions may also be overflowed to a corresponding LOFIC and/or an additional floating diffusion in each pixel circuit 104 to store the image charge. As will be discussed, in the various examples, a multifunction reset transistor is also included in each pixel circuit 104 to locally reset the LOFIC as well as the photodiode and floating diffusion with reduced image lag in accordance with the teachings of the present invention. In the various examples, readout circuit 106 may be configured to read out the image signals through column bitlines 112. In various examples, readout circuit 106 may include current sources, routing circuitry, and comparators that may be included in analog to digital converters or otherwise.

In the example, the digital image data values generated by the analog to digital converters in readout circuit 106 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 is implemented on a single semiconductor wafer. In another example, imaging system 100 is on stacked semiconductor wafers. For example, pixel array 102 is implemented on a pixel wafer, while readout circuit 106, control circuit 110 and function logic are implemented on an application specific integrated circuit (ASIC) wafer, where the pixel wafer and the ASIC wafer are interconnected by bonding (hybrid bonding, oxide bonding, or the like) or one or more through substrate vias (TSVs). For another example, pixel array 102 and control circuit 110 are implemented on a pixel wafer, while readout circuit 106, and function logic 108 are implemented on an ASIC wafer, where the pixel wafer and the ASIC wafer are stacked and interconnected by bonding (hybrid bonding, oxide bonding, or the like) or one or more TSVs.

In one example, imaging system 100 may be included in a digital camera, a cell phone, a laptop computer, an endoscope, a security camera, an automobile camera, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
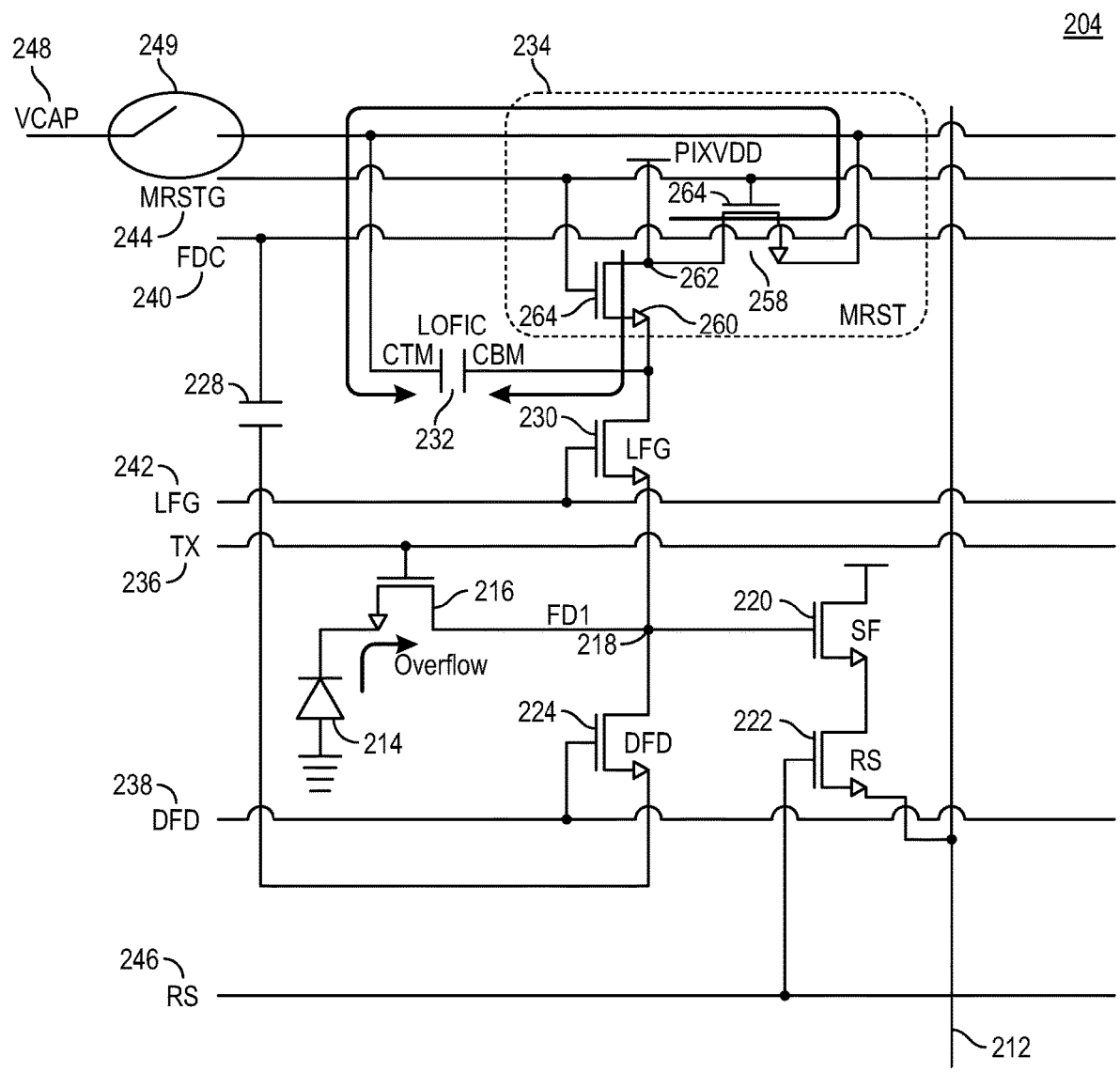
FIG. 2 illustrates a schematic of one example of a pixel circuit including a lateral overflow integration capacitor (LOFIC) coupled to a multifunction reset transistor to be reset in accordance with the teachings of the present disclosure.

FIG. 2 illustrates a schematic of one example of a pixel circuit 204 including a lateral overflow integration capacitor (LOFIC) coupled to a multifunction reset transistor to be reset in accordance with the teachings of the present disclosure. It is appreciated that the pixel circuit 204 of FIG. 2 may be an example of one of the pixel circuits 104 included in pixel array 102 as shown in FIG. 1, and that similarly named and numbered elements described above are coupled and function similarly below.

As shown in the depicted example, pixel circuit 204 includes a photodiode 214, which is configured to photogenerate image charge in response to incident light. In the depicted example, pixel circuit 204 also includes a first floating diffusion FD1 218 coupled to receive the image charge from the photodiode 214 through a transfer transistor 216, for example during a readout period associated with the pixel circuit 204. In the example, the transfer transistor 216 is coupled to be controlled in response to a transfer control signal TX 236 to transfer image charge from the photodiode 214 to the first floating diffusion FD1 218. In the example depicted in FIG. 2, it is noted that pixel circuit 204 is configured such that during an exposure or integration period of the pixel circuit 204, excess image charge photogenerated in photodiode 214 in response to bright lighting conditions is configured to overflow from the photodiode 214 to the first floating diffusion FD1 218 through the transfer transistor 216 to lateral overflow integration capacitor (LOFIC) 232 through a low conversion gain transistor 230 as shown. The LOFIC 232 may have a capacitance higher than the first floating diffusion FD1 218 and a second capacitor 228. In one example, the capacitance (or charge storing capacity) of the first floating diffusion FD1 218 and the capacitance (or charge storing capacity) of the second capacitor 228 are configured to be the same. In another example, the capacitance of the first floating diffusion FD1 218 is configured to be less than the capacitance of the second capacitor 228. The LOFIC 232 may have a charge storage capacity greater than that of the photodiode 214. A source follower transistor SF 220 has a gate coupled to the first floating diffusion FD1 218, and a row select transistor 222 is coupled to the source follower transistor SF 220 such that the source follower transistor SF 220 and the row select transistor 222 are coupled between a voltage supply and a bitline 212 to output an image signal from the pixel circuit 204 in response to a row select control signal RS 246 and the amount of charge at the gate of the source follower transistor SF 220.

In the example illustrated in FIG. 2, a dual floating diffusion transistor 224 is coupled between the first floating diffusion FD1 218 and the second capacitor 228 (e.g., additional floating diffusion). The second capacitor 228 is coupled to receive a floating diffusion capacitor signal FDC 240. In various examples, the floating diffusion capacitor signal FDC 240 is independent of the row driver signal VCAP and may range from 0 to 3V. The dual floating diffusion transistor 224 is configured to be controlled in response to a dual floating diffusion DFD control signal 238. A low conversion gain transistor 230 is coupled between the first floating diffusion FD1 218 and a second metal electrode of the lateral overflow integration capacitor (LOFIC) 232. The low conversion gain transistor 230 is configured to be controlled in response to a low conversion gain control signal LFG 242. As shown in the example depicted in FIG. 2, a first metal electrode of the LOFIC 232 is coupled to a bias voltage source 248.

In the example, the LOFIC 232 is implemented with a metal-insulator-metal capacitor including a high dielectric or high-k insulating material disposed between the first metal electrode and the second metal electrode. In various examples, the insulating material disposed between the first metal electrode and the second metal electrode of the LOFIC 232 may be single layer of high-k material or a multiple layer stack depending on the needed LOFIC capacitance. In the various examples, high-k material may include one of aluminum oxide ($Al_2O_3$), Zirconium dioxide ($ZrO_2$), Hafnium oxide (HfO), or a combination thereof. In one example, it is appreciated that the first metal electrode of LOFIC 232 may be referred to as a capacitor top metal (CTM) and the second metal electrode of LOFIC 232 may be referred to as a capacitor bottom metal (CBM).

In the depicted example, bias voltage source 248 is configured to provide a bias voltage VCAP. In the various examples, bias voltage source 248 is a row driver of the imaging system and includes a buffer 249. In one example, buffer 249 may be configured to provide a high impedance state (e.g., HiZ) as well as a low capacitor voltage (e.g., VCAPLO) or a high capacitor voltage (e.g., VCAPHI) from the bias voltage source 248 in response to a control signal. For instance, in the example depicted in FIG. 2, it is noted that buffer 249 of the bias voltage source 248 is therefore illustrated as a switch for explanation purposes, which may be opened or off to provide the high impedance state and closed or on to provide the bias voltage VCAP, such as for example VCAPLO or VCAPHI from the bias voltage source 248. In various examples, VCAPLO may be 0 ~2.0V and VCAPHI may be 2.0V~3.4V. It is appreciated that in the various examples, the VCAPLO and VCAPHI bias voltage levels may be determined in consideration of the stable range of the high-k material.

The example illustrated in FIG. 2 also shows that example pixel circuit 204 includes a multifunction reset transistor 234 in accordance with the teachings of the present invention. As shown in the depicted example, the multifunction reset transistor 234 includes a gate 264, a drain 262, a first source 258, and a second source 260. For explanation purposes, it is noted that multifunction reset transistor 234 is illustrated as two transistors that share drain 262 and gate 264 and that one of the transistors includes the first source 258 and the other transistor includes the second source 260. As will be shown, it is appreciated that instead of utilizing two separate transistors as depicted in FIG. 2 for explanation purposes, multifunction reset transistor 234 can be implemented by adding one more junction to a single transistor, which therefore shrinks the size needed to implement multifunction reset transistor 234 when compared to two separate transistors in accordance with the teachings of the preset invention.

As shown in the depicted example, the gate 264 of multifunction reset transistor 234 is coupled to receive a multifunction reset MRSTG control signal 244, the drain is 262 coupled to a reset voltage source to receive a reset voltage, such as for example the voltage PIXVDD, the first source 258 is coupled to the first metal electrode (e.g., CTM) of the LOFIC 232, and the second source 260 is coupled to the second metal electrode (e.g., CBM) of the LOFIC 232. In various examples, the PIXVDD voltage may be range from 1.2 ~3.6V. The second source 260 is also coupled to first floating diffusion region FD1 218 through the low conversion gain transistor 230. In operation, the drain 262, the first source 258, and the second source 260 of the multifunction reset transistor 234 are all coupled to each other in response to the multifunction reset MRSTG control signal 244 turning the multifunction reset transistor 234 on. The drain 262, the first source 258, and the second source 260 of the multifunction reset transistor 234 are all decoupled from one another in response to the multifunction reset MRSTG control signal 244 turning the multifunction reset transistor 234 off.

Therefore, the multifunction reset transistor 234 may be turned on to reset the LOFIC 232 locally within the pixel circuit 204 by short circuiting the first metal electrode (e.g., CTM) as well as the second metal electrode (e.g., CBM) of LOFIC 232 to the reset voltage supply during precharge periods and reset level signal readout operations, which reduces image lag in pixel circuit 204 accordance with the teachings of the present invention. It is appreciated that the photodiode 214, the first floating diffusion FD1 218, and the second capacitor 228 may also be reset at the same time through the multifunction reset transistor 234 during these periods in accordance with the teachings of the present invention.

Figure 3:
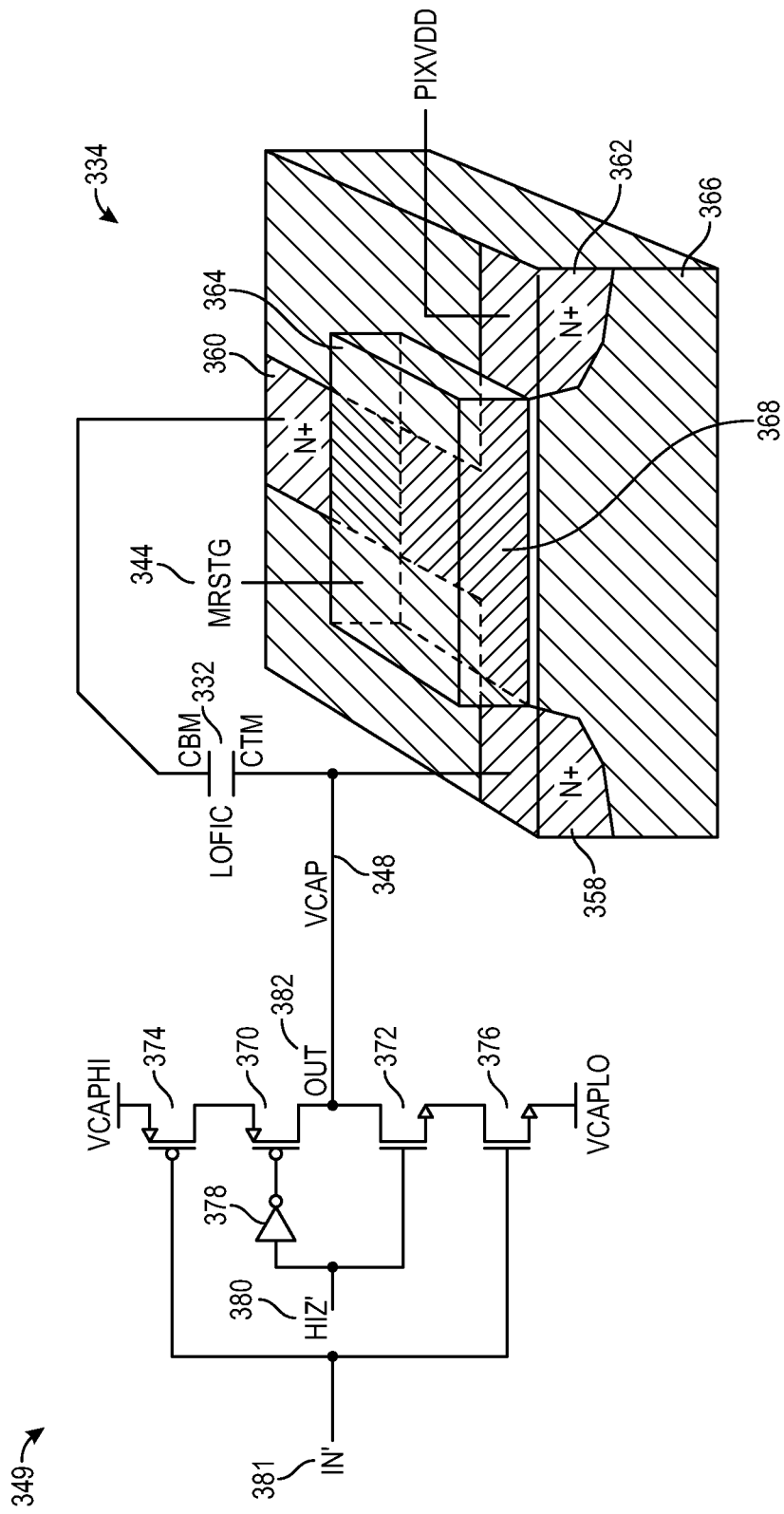
FIG. 3 illustrates a diagram showing one example of a buffer of a bias voltage source coupled to an example LOFIC and an example multifunction reset transistor of a pixel circuit in accordance with the teachings of the present disclosure.

FIG. 3 illustrates a diagram showing one example of a buffer 349 of a bias voltage source coupled to an example LOFIC and an example multifunction reset transistor 334 of a pixel circuit in accordance with the teachings of the present disclosure. It is appreciated that the example buffer 349 and the example multifunction reset transistor 334 of FIG. 3 may be examples of the buffer 249 and multifunction reset transistor 234 of a pixel circuit as shown in FIG. 2, that the and that similarly named and numbered elements described above are coupled and function similarly below.

As shown in the example depicted in FIG. 3, the buffer 349 of the bias voltage source is configured to provide a high impedance state, a high voltage value, or a low voltage value at an output 382 of the buffer 349. In one example, the output 382 of buffer 349 is configured to provide the output VCAP 348 of the bias voltage source. In one example, buffer 349 includes a first transistor 370, a second transistor 372, a third transistor 374, and a fourth transistor 376 that coupled in series between VCAPHI (e.g., a higher bias voltage) and VCAPLO (e.g., a lower bias voltage) as shown. In the example, the gate of second transistor 372 is coupled to receive an active low high impedance enable signal HiZ' 380, and the gate of first transistor 370 is coupled to receive the active low high impedance enable signal HiZ' 380 through an inverter 378. In the example, the gates of the third transistor 374 and fourth transistor 376 are coupled to receive an active low input signal IN' 381. The operation of the buffer 359 may be controlled by a control circuit (e.g., the control circuit 110 of FIG. 1) of an imaging system including the pixel circuit. In one example, the control circuit provides the active low high impedance enable signal HiZ' 380 and the active low input signal IN' 381 to the buffer 349 of the bias voltage source.

As such, during operation, when the active low high impedance enable signal HiZ' 380 is set to enable the high impedance state of buffer 349, the active low high impedance enable signal HiZ' 380 is at a low value, which turns off the first transistor 370 and the second transistor 372, which results in the output 382 being in a high impedance (e.g., HiZ) state.

When the active low high impedance enable signal HiZ' 380 is set to disable the high impedance state of buffer 349 such that the output 382 of buffer 349 is a high voltage value or low voltage value (e.g., capacitor bias voltage VCAPHI or VCAPLO) provided by the bias voltage source. As such, the active low high impedance enable signal HiZ' 380 is at a high voltage value, which turns on the first transistor 370 and the second transistor 372. When the active low input signal IN' 381 is at a low voltage value, the third transistor 374 is on and the fourth transistor 376 is off, which provides a high voltage value (e.g., capacitor bias voltage VCAPHI) at the output 382 as voltage VCAP 348. When the active low input signal IN' 381 is high, the third transistor 374 is off and the fourth transistor 376 is on, which provides a low voltage value (e.g., capacitor biasing voltage VCAPLO) at the output 382 as bias voltage VCAP 348.

Continuing with the example depicted in FIG. 3, a LOFIC 332 is illustrated including a first metal electrode (e.g., CTM) and a second metal electrode (e.g., CBM). In the example, a high dielectric or high-k insulating material disposed between the first metal electrode and the second metal electrode of LOFIC 332.

The example illustrated in FIG. 3 also shows one example of a multifunction reset transistor 334 in accordance with the teachings of the present invention. As shown in the depicted example, multifunction reset transistor 334 is disposed in a semiconductor material 366, which may be for example a silicon substrate, a silicon germanium alloy, germanium, a silicon carbide alloy, an indium gallium arsenide alloy, any other alloys formed of III-V compounds, other suitable semiconductor materials or alloys, combinations thereof, a bulk substrate thereof, or a wafer thereof. A drain 362, a first source 358, and a second source 360 are disposed in the semiconductor material 366 as shown. In the example, the drain 362, the first source 358, and the second source 360 are depicted in FIG. 3 as N+ doped regions (e.g., Arsenic or phosphorus doped regions). In the various examples, the multifunction reset transistor 334 and the low conversion gain transistor 230 may be arranged adjacent to each other in a region between adjacent photodiodes for pixel scaling benefit. The drain 362, the first source 358, and the second source 360 may be disposed (e.g., via implantation) in a P-type doped well region (not illustrated) in the semiconductor material 366. In the various examples, the multifunction reset transistor 334 and the low conversion gain transistor 230 and the source follower transistor 220 may be formed within a P-type doped well region that is coupled to a ground. It is appreciated of course that in other examples, other materials and other polarities of dopants may be utilized with corresponding updates to the logic of the circuitry coupled to multifunction reset transistor 334 in accordance with the teachings of the present invention. As shown in the example depicted in FIG. 3, the drain 362 is coupled to a reset voltage source to receive a reset voltage (e.g., voltage PIXVDD), the first source 358 is coupled the first metal electrode (e.g., CTM) of LOFIC 332, which is also coupled to the output 382 of the buffer 349 to receive voltage VCAP 348, and the second source 360 is coupled to the second metal electrode (e.g., CBM) of LOFIC 332.

Continuing with the example, a gate 364 is disposed over semiconductor material 366 as shown in FIG. 3 selectively coupling the drain 362, the first source 358, and the second source 360. In the various examples, it is appreciated that a thin gate oxide layer (e.g., having gate oxide thickness ranging from 30A to 80A) or the like (not shown) is disposed between the gate 364 and the semiconductor material 366. The gate 364 of the multifunction reset transistor 334 is coupled to receive a multifunction reset control signal MRSTG 344 (e.g., from the control circuit 110 of FIG. 1). In operation, when the multifunction reset control signal MRSTG 344 turns on the multifunction reset transistor 334, which forms an inversion channel 368 in the semiconductor material 366 under the gate 364 and between the drain 362, the first source 358, and the second source 360. As such, when the multifunction reset transistor 334 is turned on, the drain 362, the first source 358, and the second source 360 are all coupled to one another. Thus, when the multifunction reset transistor 334 is turned on, the reset voltage source is coupled to the first metal electrode (e.g., CTM) biasing the first metal electrode (e.g., CTM) and the second metal electrode (e.g., CBM) of the LOFIC 332 with reset voltage PIXVDD, which resets or auto-zeros the LOFIC 332.

It is also appreciated that when the LOFIC 332 is reset or auto-zeroed through multifunction reset transistor 334 as described, the buffer 349 is configured to be in a high impedance state in accordance with the teachings of the present invention. Therefore, it is further appreciated that LOFIC 332 is not driven by the row driver or the bias voltage source when the LOFIC 332 is reset or auto-zeroed. Instead, the LOFIC 332 is reset through multifunction reset transistor 334 driven by the reset voltage source as described, and there is no RC loading issue to the row driver because the buffer 349 of the bias voltage source is operated in the high impedance state and the LOFIC 232 is shorted and functions as common metal line. As such, the LOFIC 332 is quickly reset or auto-zeroed locally pixel-by-pixel with the multifunction reset transistor 334 included in each pixel circuit reducing row driver loading without having power shorting issue between the bias voltage source and the reset voltage source in accordance with the teachings of the present invention.

It is further appreciated, that the multifunction reset transistor 334 may be disposed in a transistor region between the photodiode (e.g., photodiode 214) and an adjacent photodiode, and the multifunction reset transistor 334 may be isolated from photodiodes by a shallow isolation trench structure, an isolation implanted region and or a combination thereof. For example, a shallow isolation trench structure having isolation depth greater than a junction depth of the drain 362, the first source 358, and the second source 360 of the multifunction reset transistor 334 is disposed between the drain 362, the first source 358, and the second source 360 and the photodiodes (e.g., photodiode 214 and an adjacent photodiode) to provide electrical isolation.

Figure 4:
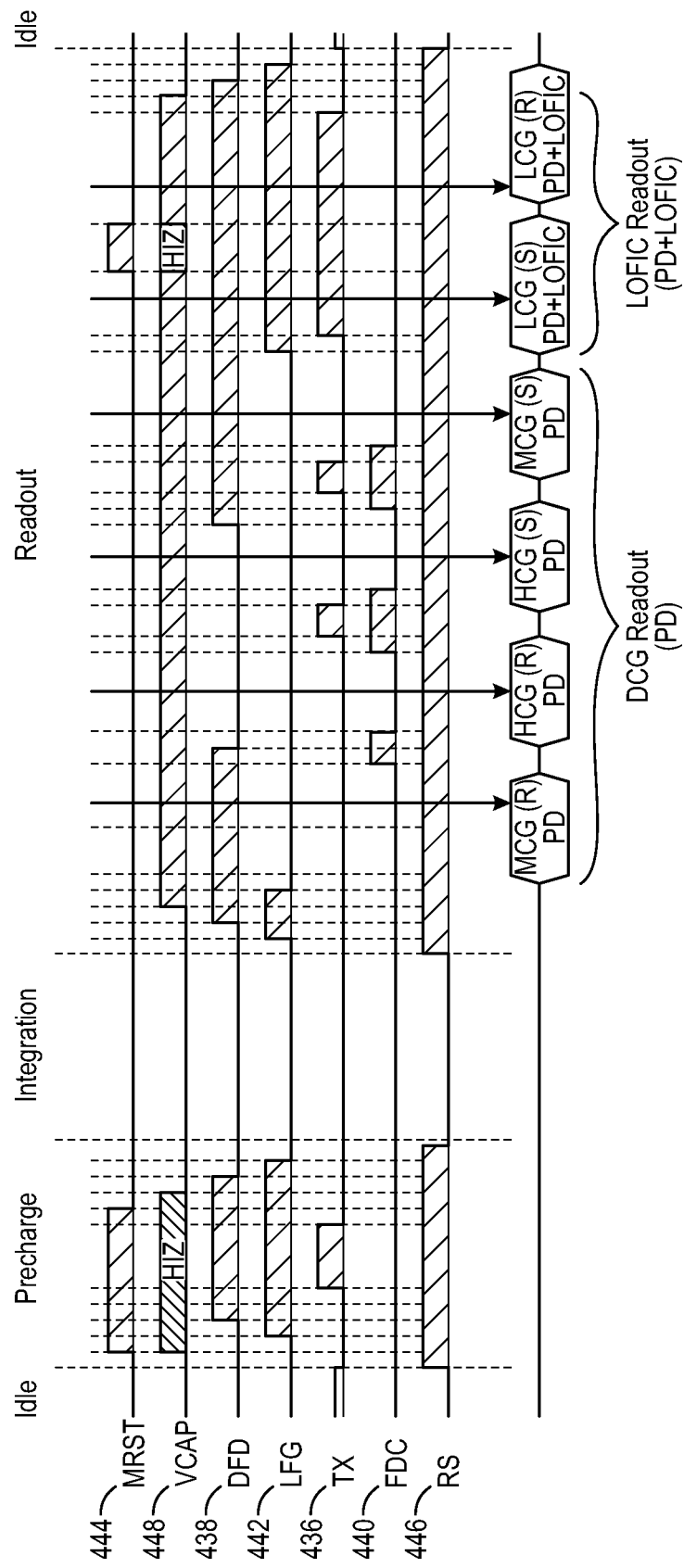
FIG. 4 illustrates one example of a timing diagram of example signal values in an example pixel circuit including an example LOFIC coupled to an example multifunction reset transistor during idle, precharge, integration, and readout periods in accordance with the teachings of the present disclosure.

FIG. 4 illustrates one example of a timing diagram of example signal values in an example pixel circuit including an example LOFIC coupled to an example multifunction reset transistor during idle, precharge, integration, and readout periods in accordance with the teachings of the present disclosure. It is appreciated that the signals depicted in FIG. 4 may be examples of the signals depicted in FIGS. 2-3, and that similarly named and numbered elements described above are coupled and function similarly below.

Referring now to the depicted example, FIG. 4 illustrates a multifunction reset control signal MRSTG 444, a bias voltage VCAP line 448, a dual floating diffusion control signal DFD 438, a low conversion gain control signal LFG 442, a transfer control signal TX 436, a floating diffusion capacitor signal FDC 440, and a row select control signal RS 446, which are configured to control the respective circuit elements discussed in detail above in FIGS. 2-3, and may be provided by a control circuit coupled to the example pixel circuit. The example depicted in FIG. 4 also illustrates the idle, precharge, integration, and readout periods that the pixel circuit cycles through in order when generating image data.

As shown during the idle period depicted in FIG. 4, most of the signals are configured to have a low voltage value. The transfer control signal TX 436 is configured to be at an intermediate voltage level (e.g., zero voltage) to allow some photogenerated image charge to overflow to from the photodiode to first floating diffusion FD1. Next, during the precharge period, which occurs after the idle period, the row select signal RS 446 turns on the row select transistor 222, and then the multifunction reset control signal MRSTG 444 turns on the multifunction reset transistor 234 and the bias voltage VCAP line 448 is set to be in the high impedance state (e.g., HiZ), which decouples the bias voltage source 248 (e.g., row driver) from the LOFIC 232 and short circuits both the first and second metal electrodes CTM and CBM of the LOFIC 232 to the reset voltage (e.g., PIXVDD) through the multifunction reset transistor 234 during the precharge period. The voltage level of the multifunction reset control signal MRSTG 444 for turning on multifunction reset transistor 234 may be configured to be greater than the voltage level of the reset voltage (e.g., PIXVDD) such that the multifunction reset transistor 234 operates in a linear operation ensuring that the first source and the second source of multifunction reset transistor 234 (e.g., first and second metal electrodes CTM and CBM) have the same potential. By short circuiting both the first and second metal electrodes CTM and CBM of the LOFIC 232 to the reset voltage (e.g., PIXVDD), the LOFIC 232 is locally auto-zeroed and a discharge operation of the LOFIC 232 is forced within pixel circuit 204, which reduces image lag in accordance with the teachings of the present invention. Next, the low conversion gain control signal LFG 442 turns on the low conversion gain transistor 230, and then the dual floating diffusion control signal DFD 438 turns on the dual floating diffusion transistor 224, and then the transfer control signal TX 436 (e.g., high biasing voltage level at a gate of the transfer transistor 216) turns on the transfer transistor 216. At this time during the precharge period, the photodiode 214, the first floating diffusion FD1 218, and the second capacitor 228, as well as the LOFIC 232 are all reset through the multifunction reset transistor 234.

Afterwards, the transfer control signal TX 436 (e.g., low biasing voltage level or negative biasing voltage) turns off the transfer transistor 216, and then the multifunction reset control signal MRSTG 444 turns off the multifunction reset transistor 244, and then the bias voltage VCAP line 448 transitions to a low bias voltage value (e.g., VCAPLO) from the high impedance state (e.g., HiZ), and then the dual floating diffusion control signal DFD 438 turns off the dual floating diffusion transistor 224, and then the low conversion gain control signal LFG 442 turns off the low conversion gain transistor 230, and then the row select signal RS 446 turns off the row select transistor 222. It is appreciated that the multifunction reset control signal MRSTG 444 is transited from high voltage level to low voltage level before the bias voltage VCAP line 448 transits from high impedance state (e.g., HiZ) to a normal voltage supplying state (e.g., low bias voltage level) biasing the second metal electrode (e.g., CBM) of LOFIC 232 to prevent power shorting issue (e.g., shorting between the bias voltage source and the reset voltage source).

The example depicted in FIG. 4 shows that during the integration period, which occurs after the precharge period, all of the signals are low and integration occurs, during which time the photodiode 214 generates image charge in response to incident light. During the integration period, excess photogenerated image charges may be configured to overflow first to first floating diffusion FD1 218, then to LOFIC 232 through low conversion gain transistor 230 and/or to second capacitor 228 through dual floating diffusion transistor 224 for storage. For example, under a strong light condition (e.g., LED light or infrared light), when the photodiode saturates, excess photogenerated image charges may first overflow to first floating diffusion FD1 218, to the second capacitor 228 through dual floating diffusion transistor 224 when the first floating diffusion FD1 218 is full, and to the LOFIC 232 through low conversion gain transistor 230 when second capacitor 228 is also full for storage.

The example depicted in FIG. 4 shows that during the readout period, which occurs after the integration period, the row select signal RS 446 turns on the row select transistor 222, and then the low conversion gain control signal LFG 442 is pulsed to turn on the low conversion gain transistor 230, and then the dual floating diffusion control signal DFD 438 turns on the dual floating diffusion transistor 224, and then the bias voltage VCAP line 448 transitions to the high bias voltage value (e.g., VCAPHI).

Next, a dual conversion gain (DCG) readout of the photodiode occurs during which time a medium conversion gain (MCG) readout of a reset value (R) from the photodiode 214 occurs. Next, the floating diffusion capacitor signal FDC 440 is pulsed while the dual floating diffusion control signal DFD 438 turns off the dual floating diffusion transistor 224. Next, a high conversion gain (HCG) readout of a reset value (R) from the photodiode 214 occurs. Next, the floating diffusion capacitor signal FDC 440 transitions to a high voltage value, and the transfer control signal TX 436 turns on the transfer transistor 216, during which time image charge in the photodiode 214 transfers to the first floating diffusion FD1 218. Next, a high conversion gain (HCG) readout of a signal value (S) may occur, i.e., signal readout from the first floating diffusion FD1 218 based on effective capacitance of the first floating diffusion FD1 218. Next, the dual floating diffusion control signal DFD 438 turns on the dual floating diffusion transistor 224, the floating diffusion capacitor signal FDC 440 transitions to a high value, and the transfer control signal TX 436 turns on the transfer transistor 216, during which time image charge in the photodiode 214 transfers to the first floating diffusion FD1 218 and the second capacitor 228. Next, a medium conversion gain (MCG) readout of a signal value (S) may occur, i.e., signal readout from the first floating diffusion FD1 218 and the second capacitor 228 based on effective capacitance of the first floating diffusion FD1 218 and the second capacitor 228.

Next, a LOFIC readout of the photodiode 214 and the LOFIC 232 occurs, during which time the low conversion gain control signal LFG 442 turns on the low conversion gain transistor 230, and then the transfer control signal TX 436 turns on the transfer transistor 216, during which time image charge in the photodiode 214 transfers to the first floating diffusion FD1 218, the second capacitor 228, and the LOFIC 232. Next, a low conversion gain (LCG) readout of a signal value (S) may occur, i.e., signal readout from the first floating diffusion FD1 218, the second capacitor 228, and the LOFIC 232 based on effective capacitance of the first floating diffusion FD1 218, the second capacitor 228, and the LOFIC 232. Next, the multifunction reset control signal MRSTG 444 turns on the multifunction reset transistor 234 and the bias voltage VCAP line 448 is set to be in the high impedance state (e.g., HiZ), which decouples the bias voltage source 248 (e.g., row driver) from the LOFIC 232 and short circuits both the first and second metal electrodes CTM and CBM of the LOFIC 232 to the reset voltage (e.g., PIXVDD) through the multifunction reset transistor 234 during this reset signal readout period. By short circuiting both the first and second metal electrodes CTM and CBM of the LOFIC 232 to the reset voltage (e.g., PIXVDD), the LOFIC 232 is locally auto-zeroed and a discharge operation of the LOFIC 232 is forced within pixel circuit 204. In addition, during this time, the photodiode 214, the first floating diffusion FD1 218, the second capacitor 228, as well as the LOFIC 232 are all reset through the multifunction reset transistor 234. Afterwards, the multifunction reset control signal MRSTG 444 turns off the multifunction reset transistor 244, and then the bias voltage VCAP line 448 transitions to the high bias voltage value (e.g., VCAPHI) from the high impedance state (e.g., HiZ) to decouple the bias voltage VCAP line 448 and the LOFIC 232, and then a low conversion gain (LCG) readout of the a reset value (R) occurs, after which time the transfer control signal TX 436 turns off the transfer transistor 216, and then the bias voltage VCAP line 448 transitions to the low bias voltage value (e.g., VCAPLO), and then the dual floating diffusion control signal DFD 438 turns off the dual floating diffusion transistor 224, and then the low conversion gain control signal LFG 442 turns off the low conversion gain transistor 230. It is appreciated that the multifunction reset control signal MRSTG 444 is configured to transit from high voltage level to low voltage level before or at the same time as the bias voltage VCAP line 448 transits from high impedance state (e.g., HiZ) to a normal voltage supplying state (e.g., high bias voltage level) biasing the second metal electrode (e.g., CBM) of LOFIC 232 to prevent power shorting issue (e.g., shorting between the bias voltage source and the reset voltage source).

Next, the process described in FIG. 4 cycles back to an idle period for next frame capturing operation, and the cycle repeats in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel circuit, comprising:
a photodiode configured to photogenerate image charge in response to incident light;
a floating diffusion coupled to receive the image charge from the photodiode;
a transfer transistor coupled between the photodiode and the floating diffusion, wherein the transfer transistor is configured to transfer the image charge from the photodiode to the floating diffusion;
a lateral overflow integration capacitor (LOFIC) including an insulating region disposed between a first metal electrode and a second metal electrode, wherein the first metal electrode is coupled to a bias voltage source, wherein the second metal electrode is selectively coupled to the floating diffusion; and
a multifunction reset transistor having a gate, a drain, a first source, and a second source, wherein the gate is coupled to a multifunction reset control signal, wherein the drain, the first source, and the second source are coupled to each other in response to the multifunction reset control signal turning the multifunction reset transistor on, wherein the drain, the first source, and the second source are decoupled from one another in response to the multifunction reset control signal turning the multifunction reset transistor off, wherein the drain is coupled to a reset voltage source, wherein the first source is coupled to the first metal electrode, wherein the second source is coupled to the second metal electrode.

2. The pixel circuit of claim 1, wherein during a precharge period and during a readout period, the multifunction reset transistor is configured to be turned on and a buffer of the bias voltage source coupled to the first metal electrode is configured to be in a high impedance state to provide zero biasing across the LOFIC to discharge the LOFIC while resetting the pixel circuit, wherein the precharge period occurs prior to an integration period, wherein the precharge period and the integration period occur between an idle period and the readout period.

3. The pixel circuit of claim 2, wherein during the precharge period, the multifunction reset transistor is configured to be turned off before the buffer of the bias voltage source is configured to transition from the high impedance state to providing a first bias voltage to the first metal electrode during the precharge period.

4. The pixel circuit of claim 3, wherein during the readout period, the multifunction reset transistor is configured to be off and the bias voltage source is configured to provide a second bias voltage to the first metal electrode, wherein the first bias voltage is a low capacitor bias voltage, wherein the second bias voltage is a high capacitor bias voltage greater than the low capacitor bias voltage.

5. The pixel circuit of claim 4, wherein a voltage level of the multifunction reset control signal for turning on multifunction reset transistor is greater than a voltage level of the reset voltage source.

6. The pixel circuit of claim 5, wherein the multifunction reset transistor is configured to be turned on and the buffer of the bias voltage source is configured to be in the high impedance state to provide zero biasing across the LOFIC while resetting the pixel circuit during the readout period prior to a readout of a reset signal value from the LOFIC.

7. The pixel circuit of claim 1, wherein the pixel circuit further comprises:
a dual floating diffusion (DFD) transistor coupled to the floating diffusion, wherein the DFD transistor is configured to be switched in response to a DFD control signal;
a second capacitor, wherein the DFD transistor is coupled between the floating diffusion and the second capacitor; and
a low conversion gain (LFG) transistor coupled between the floating diffusion and the second metal electrode, wherein the LFG transistor is configured to be switched in response to an LFG control signal.

8. The pixel circuit of claim 7, further comprising:
a source follower transistor having a gate coupled to the floating diffusion; and
a row select transistor coupled to the source follower transistor, wherein the source follower transistor and the row select transistor are coupled between a power line and a bitline.

9. An imaging system, comprising:
a pixel array including a plurality of pixel circuits arranged in a plurality of rows and a plurality of columns, wherein each one of the pixel circuits includes:
a photodiode configured to photogenerate image charge in response to incident light;
a floating diffusion coupled to receive the image charge from the photodiode;
a transfer transistor coupled between the photodiode and the floating diffusion, wherein the transfer transistor is configured to transfer the image charge from the photodiode to the floating diffusion;
a lateral overflow integration capacitor (LOFIC) including an insulating region disposed between a first metal electrode and a second metal electrode, wherein the second metal electrode is selectively coupled to the floating diffusion; and
a multifunction reset transistor having a gate, a drain, a first source, and a second source, wherein the gate is coupled to a multifunction reset control signal, wherein the drain, the first source, and the second source are coupled to each other in response to the multifunction reset control signal turning the multifunction reset transistor on, wherein the drain, the first source, and the second source are decoupled from one another in response to the multifunction reset control signal turning the multifunction reset transistor off, wherein the drain is coupled to a reset voltage source, wherein the first source is coupled to the first metal electrode, wherein the second source is coupled to the second metal electrode;
a bias voltage source coupled to the first metal electrode;
a control circuitry coupled to the pixel array to control operation of the pixel array; and
a readout circuitry coupled to the pixel array to read out image data from the plurality of pixel circuits.

10. The imaging system of claim 9, further comprising function logic coupled to the readout circuitry to store the image data from each one of the plurality of pixel circuits.

11. The imaging system of claim 9, wherein during a precharge period and during a readout period, the multifunction reset transistor is configured to be turned on and a buffer of the bias voltage source is configured to be in a high impedance state to provide zero biasing across the LOFIC to discharge the LOFIC while resetting the pixel circuit, wherein the precharge period occurs prior to an integration period, wherein the precharge period and the integration period occur between an idle period and the readout period.

12. The imaging system of claim 11, wherein during the precharge period, the multifunction reset transistor is configured to be turned off before the buffer of the bias voltage source is configured to transition from the high impedance state to providing a first bias voltage to the first metal electrode during the precharge period.

13. The imaging system of claim 12, wherein during the readout period, the multifunction reset transistor is configured to be off and the bias voltage source is configured to provide a second bias voltage to the first metal electrode, wherein the first bias voltage is a low capacitor bias voltage, wherein the second bias voltage is a high capacitor bias voltage greater than the low capacitor bias voltage.

14. The imaging system of claim 13, wherein a voltage level of the multifunction reset control signal for turning on multifunction reset transistor is greater than a voltage level of the reset voltage source.

15. The imaging system of claim 14, wherein the multifunction reset transistor is configured to be turned on and the buffer of the bias voltage source is configured to be in the high impedance state to provide zero biasing across the LOFIC while resetting the pixel circuit during the readout period prior to a readout of a reset signal value from the LOFIC.

16. The imaging system of claim 9, wherein each one of the pixel circuits further comprises:
 a dual floating diffusion (DFD) transistor coupled to the floating diffusion, wherein the DFD transistor is configured to be switched in response to a DFD control signal;
 a second capacitor, wherein the DFD transistor is coupled between the floating diffusion and the second capacitor; and
 a low conversion gain (LFG) transistor coupled between the floating diffusion and the second metal electrode, wherein the LFG transistor is configured to be switched in response to an LFG control signal.

17. The imaging system of claim 16, wherein each one of the pixel circuits further comprises:
 a source follower transistor having a gate coupled to the floating diffusion; and
 a row select transistor coupled to the source follower transistor, wherein the source follower transistor and the row select transistor are coupled between a power line and a bitline.

* * * * *